United States Patent
Al Ismail et al.

(10) Patent No.: US 12,086,512 B2
(45) Date of Patent: Sep. 10, 2024

(54) METHOD TO AUTOMATICALLY PICK FORMATION TOPS USING OPTIMIZATION ALGORITHM

(71) Applicant: SAUDI ARABIAN OIL COMPANY, Dhahran (SA)

(72) Inventors: Marwah Al Ismail, Savhat (SA); Mokhles M. Mezghani, Dhahran (SA); Mohammed Ali Al-Masrahy, Alkhobar (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 341 days.

(21) Appl. No.: 17/203,621

(22) Filed: Mar. 16, 2021

(65) Prior Publication Data
US 2022/0300674 A1   Sep. 22, 2022

(51) Int. Cl.
*G06F 30/20* (2020.01)
*E21B 43/00* (2006.01)
(Continued)

(52) U.S. Cl.
CPC .............. *G06F 30/20* (2020.01); *E21B 43/00* (2013.01); *G06Q 50/08* (2013.01); *E21B 2200/20* (2020.05); *G06F 30/13* (2020.01)

(58) Field of Classification Search
CPC .......... G06F 30/20; G06F 30/13; E21B 43/00; E21B 2200/20; G06Q 50/08;
(Continued)

(56) References Cited

U.S. PATENT DOCUMENTS

| 6,012,017 A * | 1/2000 | Van Bemmel ........... G01V 1/50 |
| | | 702/14 |
| 2014/0156193 A1 | 6/2014 | Cheskis et al. |

(Continued)

FOREIGN PATENT DOCUMENTS

| WO | 2014172565 A1 | 10/2014 |
| WO | 2015042103 A1 | 3/2015 |

OTHER PUBLICATIONS

Wang B, Sharma J, Chen J, Persaud P. Ensemble machine learning assisted reservoir characterization using field production data—an offshore field case study. Energies. Feb. 17, 2021;14(4):1052. (Year: 2021).*

(Continued)

*Primary Examiner* — Eunhee Kim
(74) *Attorney, Agent, or Firm* — Osha Bergman Watanabe & Burton LLP (57) ABSTRACT

A method including obtaining, by a computer processor, at least one key log in each of a set of training wells located, at least partially, within a hydrocarbon reservoir, identifying a target formation bounding surface in each of the set of training wells, and generating an initial depth surface for the target formation bounding surface from the target formation bounding surface in each of the set of training wells. The method further including, determining from the initial depth surface an initial depth estimate of the target formation bounding surface at a location of a current well, forming an objective function based, at least in part on a correlation between each key log in each of the set of training wells, and each corresponding key log in the current well, and optimizing the objective function by varying a depth shift between each of the set of training wells and the current well, to determine an optimum depth shift that produces an extremum of the objective function. The method still further including combining the initial depth estimate of the target (Continued)

formation bounding surface at the location of the current well with the optimum depth shift to produce a final depth estimate of the target formation bounding surface at the location of the current well.

18 Claims, 8 Drawing Sheets

(51) Int. Cl.
  *G06F 30/13* (2020.01)
  *G06Q 50/08* (2012.01)
(58) Field of Classification Search
  CPC ....... G01V 2200/16; G01V 2210/6169; G01V 2210/643; G01V 1/50; G01V 2210/6652; G01V 11/00; G01V 99/005; G01V 1/301
  See application file for complete search history.

(56) References Cited

U.S. PATENT DOCUMENTS

| | | | | |
|---|---|---|---|---|
| 2014/0316706 | A1* | 10/2014 | Grant | G01V 1/362 702/11 |
| 2015/0088424 | A1* | 3/2015 | Burlakov | G01V 99/00 702/6 |
| 2016/0124116 | A1 | 5/2016 | Souche et al. | |
| 2016/0139299 | A1* | 5/2016 | Leger | G01V 1/301 703/2 |
| 2021/0340861 | A1* | 11/2021 | Al Ismail | E21B 49/00 |
| 2022/0114302 | A1* | 4/2022 | Skripkin | G06F 30/20 |
| 2022/0300674 | A1* | 9/2022 | Al Ismail | E21B 43/00 |

OTHER PUBLICATIONS

Wang, B., Sharma, J., Chen, J. and Persaud, P., 2021. Ensemble machine learning assisted reservoir characterization using field production data—an offshore field case study. Energies, Feb. 17, 2021;14(4):1052 (Year: 2021).*

Guevara, Jorge et al., "A data-driven workflow for predicting horizontal well production using vertical well logs", Proceedings of the Workshop on Data Mining for Oil and Gas, Apr. 2017, pp. 1-6 (6 pages).

Kim, Hyoung-Moon et al., "Analyzing nonstationary spatial data using piecewise Gaussian processes", Journal of the American Statistical Association, vol. 100, Issue 470, Jun. 2005, pp. 1-34 (34 pages).

International Search Report and Written Opinion issued in Application No. PCT/US2022/020616, mailed on Jun. 8, 2022 (15 pages).

* cited by examiner

METHOD TO AUTOMATICALLY PICK FORMATION TOPS USING OPTIMIZATION ALGORITHM

BACKGROUND

Identifying the shape of rock formations is an important task in developing and producing a hydrocarbon reservoir and one routinely undertaken in the oil and gas industry. The shape of a formation includes its lateral extent and the topography of the bounding surfaces above and below the reservoir. This information is important for calculating the volume of the reservoir, which influences the quantity of hydrocarbon the reservoir may contain, and for planning future well locations and production strategies. One element of determining the shape of a formation is identifying the depth at which a plurality of wells intersect it. This activity, often referred to as "formation top picking", may be supplemented by reference to seismic maps and images to interpolate and extrapolate the bounding surfaces between wells.

Manual formation top picking involves two major steps. First, one or more suitable well logs, measuring a quantity such as resistivity, gamma ray, density, or sonic slowness, must be identified. A suitable well log should show a clear difference between the section of the well log recorded within the formation of interest and the sections recorded in adjacent formations above or below it. Such a difference is often referred to as a signature. A clear signature may be a sharp change between the value of the log in the formation of interest and the value in the formation immediately above or below. Other more subtle signature bases are also used.

Second, a geoscientist manually inspects the suitable well log(s) in each well in the field to find the depth in the well at which the signature is visible and identifies that position in the well as a point on the bounding surface of the formation. The point has a depth and two horizontal coordinates. This process of manual inspection and identification is prone to error and the individual biases of the geoscientist performing the process.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to a method including obtaining, by a computer processor, at least one key log in each of a set of training wells located, at least partially, within a hydrocarbon reservoir, identifying a target formation bounding surface in each of the set of training wells, and generating an initial depth surface for the target formation bounding surface from the target formation bounding surface in each of the set of training wells. The method further including, determining from the initial depth surface an initial depth estimate of the target formation bounding surface at a location of a current well, forming an objective function based, at least in part on a correlation between each key log in each of the set of training wells, and each corresponding key log in the current well, and optimizing the objective function by varying a depth shift between each of the set of training wells and the current well, to determine an optimum depth shift that produces an extremum of the objective function. The method still further including combining the initial depth estimate of the target formation bounding surface at the location of the current well with the optimum depth shift to produce a final depth estimate of the target formation bounding surface at the location of the current well.

In general, in one aspect, embodiments relate to a non-transitory computer readable medium storing instructions executable by a computer processor, the instructions including functionality for obtaining at least one key log in each of a set of training wells located, at least partially, within a hydrocarbon reservoir, identifying a target formation bounding surface in each of the set of training wells, and generating an initial depth surface for the target formation bounding surface from the target formation bounding surface in each of the set of training wells. Further the instructions including functionality for determining from the initial depth surface for the target formation bounding surface an initial depth estimate of the target formation bounding surface at a location of a current well, forming an objective function based, at least in part, on the correlation between each key log in each of the set of training wells and each corresponding key log in the current well, and optimizing the objective function by varying a depth shift between each of the set of training wells and the current well to determine an optimum depth shift that produces an extremum of the objective function. Still further the instructions including functionality for combining the initial depth estimate of the target formation bounding surface at the location of the current well with the optimum depth shift to produce a final depth estimate of the target formation bounding surface at the location of the current well.

Other aspects and advantages of the claimed subject matter will be apparent from the following description and the appended claims.

BRIEF DESCRIPTION OF DRAWINGS

Specific embodiment of the disclosed technology will now be described in detail with reference to the accompanying figures. Like elements in the various figures are denoted by like reference numerals for consistency.

DETAILED DESCRIPTION

In the following detailed description of embodiment of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Generally, the embodiments disclosed relate to a novel automated method for determining the depth at which a formation bounding surface intersects one or more wells. Further, the embodiments disclose a system for implementing the novel automated method that includes manually identifying a formation bounding surfaces on one or more well logs in a number of training wells, predicting a depth range of depth at which the bounding surface is intersected by a plurality of candidate wells, then identifying a depth within the range of depths at which the bounding surface is intersected by a plurality of candidate wells. One or more embodiments may provide a standardized and automated process that can identify the intersection of the bounding surface with each well quickly and reliably.

Figure 1:
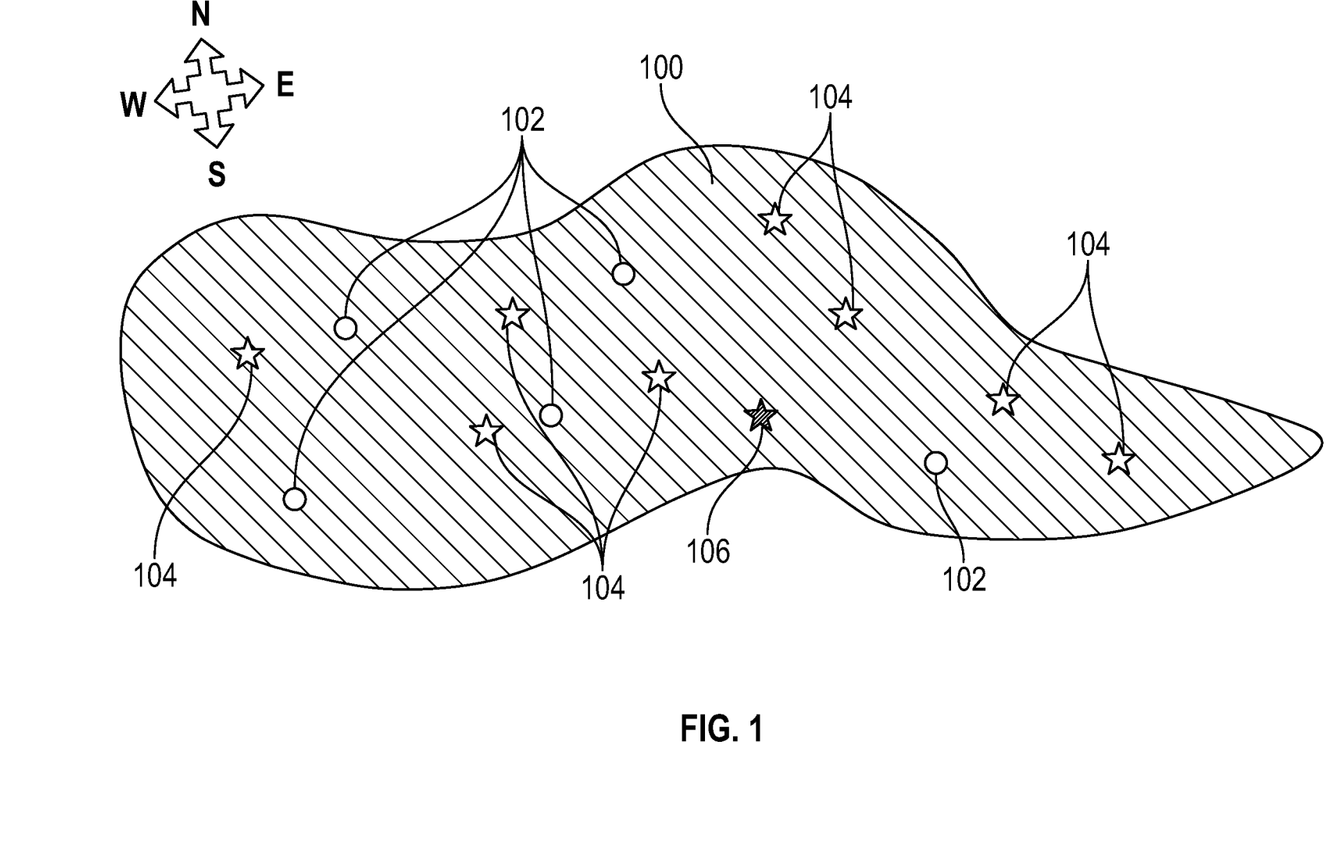
FIG. 1 shows a map view of a hydrocarbon reservoir and a plurality of wells in accordance with one or more embodiments.

FIG. 1 depicts a map perspective of a hydrocarbon reservoir (100) and the location (102, 104, 106) of a plurality of wells which intersect the hydrocarbon reservoir (100). In accordance with one ore more embodiments, some of the wells may be selected as training wells (102). The remainder of the wells may be designated as "unpicked" wells (104). One well, designated the "current" well (106) may be selected from the plurality of unpicked wells (104) and the intersection of the bounding surface of the formation with the current well (106) may be determined. During the execution of the method disclosed herein, each of the unpicked wells (104) will be selected, in turn, as a current well (106).

Figure 2:
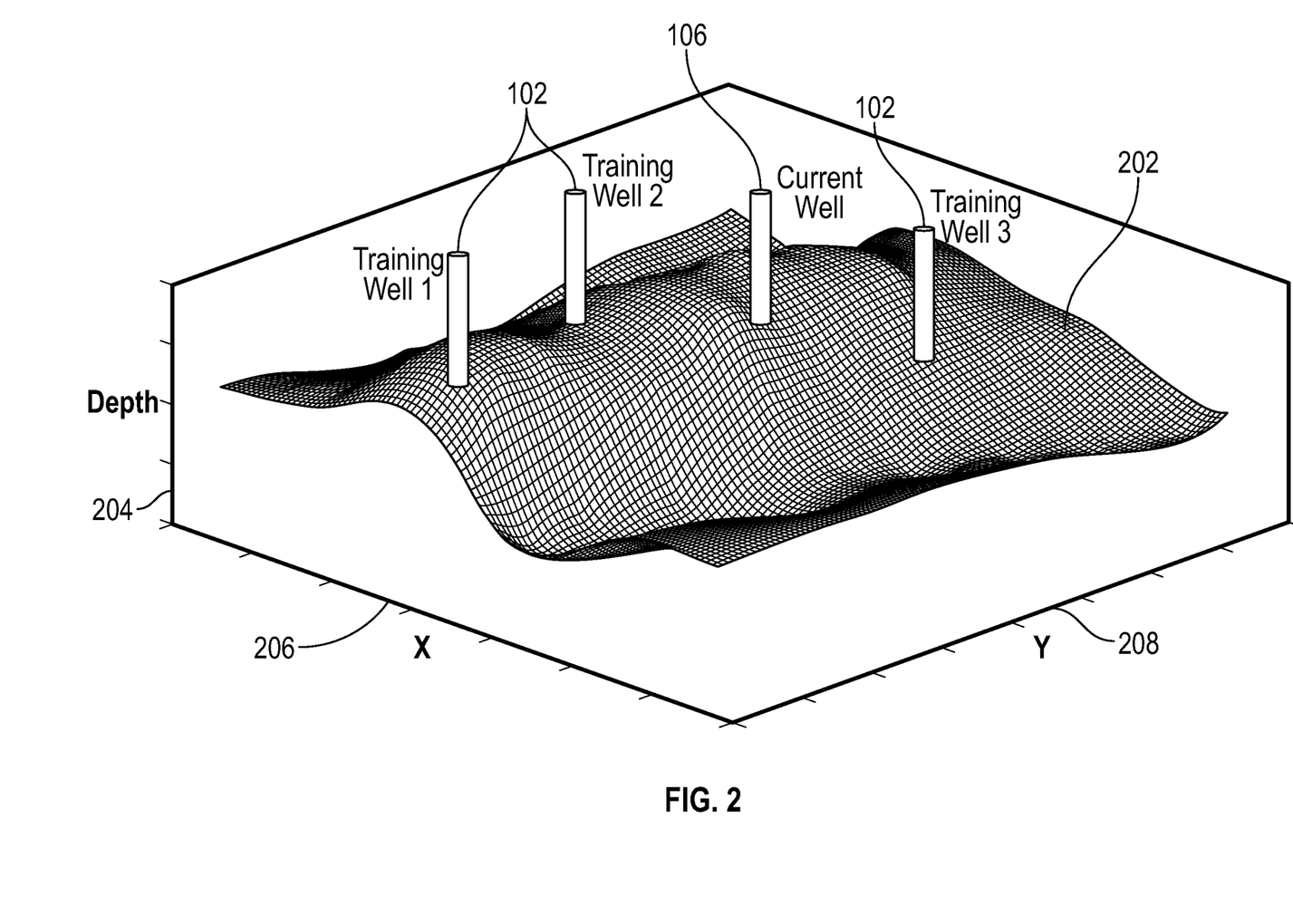
FIG. 2 shows a formation bounding surface and well locations in accordance with one or more embodiments.

FIG. 2 shows a 3D perspective of a portion of a formation bounding surface (202), in accordance with one or more embodiments. The vertical axis (204) shows the depth of the bounding surface (202) below the Earth's surface, and the other two axes (206, 208) indicate orthogonal horizontal position, such as North-South and East-West. The formation bounding surface (202) may the top of the hydrocarbon reservoir (100) or it may be the bottom of the hydrocarbon reservoir (100). According to other embodiments, the formation bounding surface (202) may be the bounding surface for a formation at a shallower or a deeper depth than the hydrocarbon reservoir (100). The formation bounding surface (202) may be penetrated by a number of training wells (102), a current well (106), and a number of unpicked wells (not shown).

Figure 3:
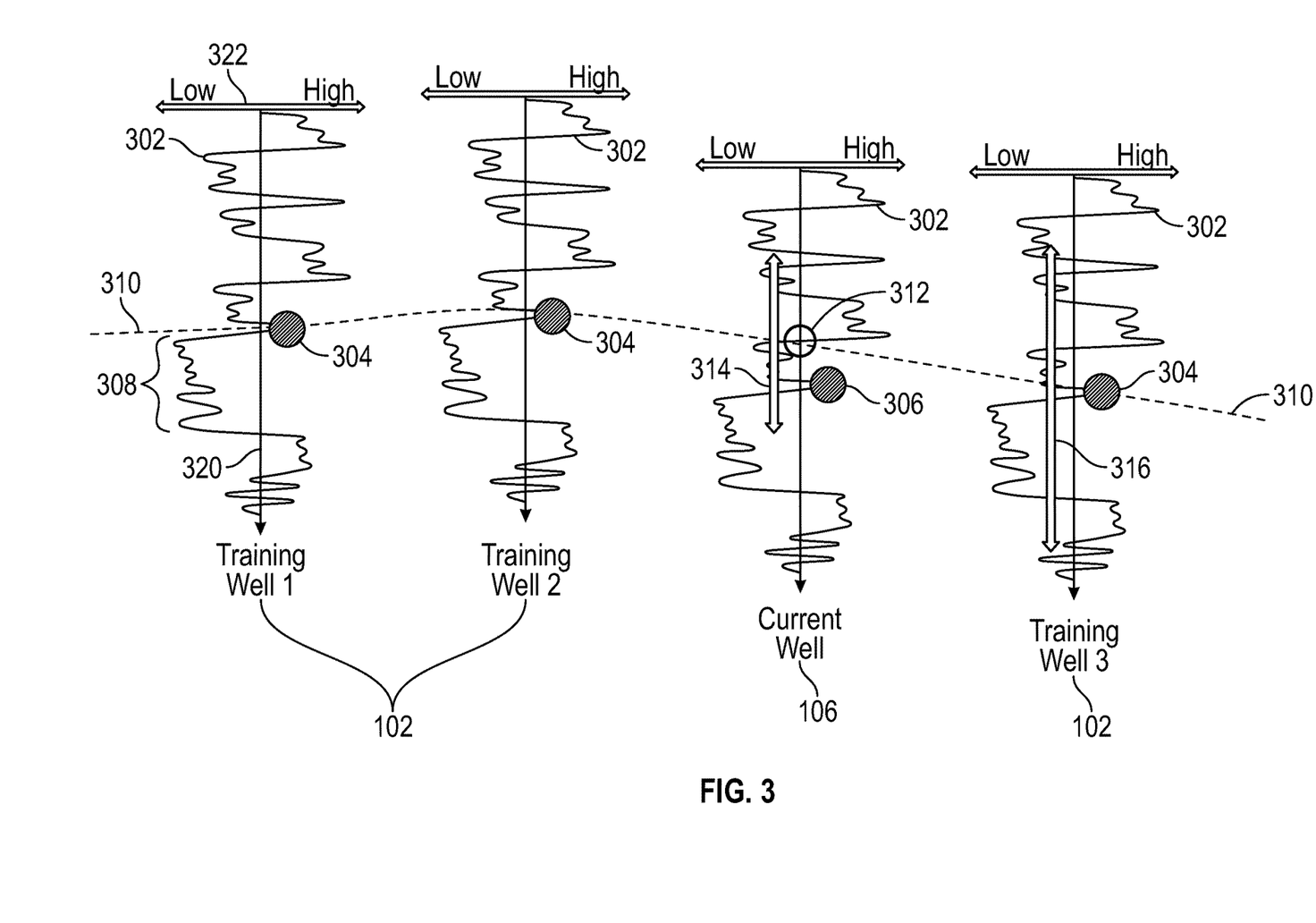
FIG. 3 shows one key log in 3 training wells and a current well in accordance with one or more embodiments.

In accordance with one or more embodiments, at least one well log has been recorded in each training well (102) and in the current well (106). FIG. 3 shows an example of well logs recorded in each of the training wells (102) and the current well (106). The well logs (302) are a measurement of a physical quantity, such as electrical resistivity, mass density, gamma ray emission, or sonic propagation speed, at a plurality of depths along each of the training wells (102) and the current well (106). The well log (302) may have a measurement of the physical quantity at a plurality of measurement positions along the well (102, 106). These measurement positions may be spaced at a uniform interval along the well. The uniform interval is commonly 6 inches, although it may be larger or small than 6 inches. In accordance with other embodiments, the measurement positions may be spaced at irregular, including random, positions. In other embodiments, the measurement positions may be spaced at regular intervals except for measurement positions where the measurement is absent. In the example shown in FIG. 3 the depth axis (320) runs vertically and the horizontal axis (322) shows the value of the measured physical quantity with low values to the left and high values to the right. Other plotting conventions are possible without affecting the scope of the invention.

FIG. 3 further shows, in accordance with one or more embodiments, the picked depth (304) at which a formation bounding surface (202) intersects each training well (102) and the true depth (306) at which the formation bounding surface (202) intersects the current well (106). In the example shown in FIG. 3 the formation bounding surface (202) is identified as the first peak of the log above a window (308) showing plurality of low measurement values. However, one skilled in the art will readily appreciate that this example is merely one of many possible examples in different wells, different formations, and different geographical locations.

FIG. 3 also shows an estimated surface (310) joining the picked depths (304) in the training wells (102). The estimated surface (310) provides an estimate of the position of the formation bounding surface (202) between the training wells (102). Further, the estimated surface (310) provides an estimated depth (312) at which the estimated surface (310) intersects the current well (106). In some cases, the estimated depth (312) may equal the true depth (306) at which the formation bounding surface (202) intersects the current well (106). However, in many cases, such as the one illustrated in FIG. 3, there may be a discrepancy between the estimated depth (312) and the true depth (306). The discrepancy may arise for any one of a number or reasons. For example, there anomalously large curvature of a portion of the formation bounding surface (202) that causes a rapid change of depth between the current well (106) and the training well (102) closest to the current well (106). Alternatively, there may be a geological fault located between the training well (102) and the current well (106) that produces an unanticipated discontinuous change in depth of the formation bounding surface (202).

Between the training wells (102) the estimated surface (310) may be an interpolated surface, and beyond the training wells (102) the estimated surface (310) may be an extrapolated surface. The estimated surface (310) may interpolated using kriging. Kriging is a generic term for a range of least-squares methods to provide the best, minimum variance, linear unbiased predictions. Ordinary kriging, as described in "*Principles of geostatistics*", 1965, *Econ. Geol.* 58, 1246-1266 by *Matheron* (1965), requires only an estimate of the variogram function of the data and data for its implementation. Consequently, ordinary kriging is widely used for interpolating, extrapolation, and other purposes within geostatistics.

Ordinary kriging solves a set of linear equations, known as the kriging system, which contain semi-variances drawn from a variogram function fitted to the data. For example, if $z(x_i)$, $i=1, 2, \ldots, N$, is the picked depths (304) in N training wells (102), where $x_i \equiv (x_1, x_2)_i^T$ is a two dimensional coordinate vector specifying the horizontal location of the i-th well at its picked depth (304), then the depth of the estimated surface (310) at a point with horizontal coordinates $x_0$ is given by:

$$z(x_0) = \Sigma_{i=1}^{N} \lambda_i z(x_i).  \quad \text{Equation (1)}$$

The $\lambda_i$, i=1, 2, ..., N are weights chosen to minimize the prediction error variance by solution of the following set of equations:

$$\sum_{i=1}^{N} \lambda_i \gamma(x_i-x_j)+\psi(x_0)=\gamma(x_i-x_j) \text{ for all } j; \quad \text{Equation (2)}$$

$$\sum_{i=1}^{N} \lambda_i = 1 \quad \text{Equation (3)}$$

where $\gamma(x_i-x_j)$ is the semi-variance between the i-th and j-th training wells (102), $\gamma(x_i-x_0)$ is the semi-variance between the i-th training well and point with horizontal coordinates $x_0$, and $\psi(x_0)$ is a Lagrange multiplier introduced to minimize the error variance. Equations (1)-(3) give the depth of the estimated surface (310) at any horizontal location, $x_0$, including at the location of the current well (106) where $z(x_0)$ is the estimated depth (312). Equations (1)-(3) introduce new parameters, N and $\psi(x_0)$ which must be predetermined.

Other methods for determining the estimated surface (310) may be used, in accordance with one or more embodiments. For example, the estimation may be performed using Bayesian estimation, machine learning method such artificial neural networks, radial basis function (RBF) interpolations, spline interpolations, or any other suitable method familiar to one of ordinary skill in the art, with departing form the scope of the invention. Seismic data may be used to constrain the determination of the estimated surface (310). However, seismic data is not essential to determining the estimated surface (310).

In accordance with one or more embodiments, a maximum depth shift window (314) may be determined. The maximum depth shift window (314) may be disposed around the estimated depth (312). The maximum depth shift window (314) bounds the portion of the well log (302) which may be search to identify a better estimate of the true depth (306) at which the estimated surface (310) intersects the current well (106). In some embodiments, the maximum depth shift window may be symmetrically disposed around the estimated depth (312), extending an equal distance above and below the estimated depth (312). In other embodiments the maximum depth shift window (314) may be asymmetrically disposed around the estimated depth (312). The size of the maximum depth shift window (314) may be predetermined based, at least in part upon the characteristics of the well log (302), such as an auto-correlation, a variance, or a spatial wavelength spectrum.

In accordance with one or more embodiments, a cross-correlation window (316) may be determined. The cross-correlation window (316) determines the portion of the well log (302) which may be used to calculate a cross-correlation between a well log (302) in a training well (102) and a well log (302) in the current well (106). The cross-correlation window (316) may be symmetrically or asymmetrically disposed about the picked depth (304) in the training well (102). The cross-correlation window (316) may be larger than, equal to, or smaller than the maximum depth shift window (314). The size of the cross-correlation window (316) may be predetermined based, at least in part upon the characteristics of the well log (302), such as an auto-correlation, a variance, or a spatial wavelength spectrum.

In accordance with one or more embodiments, current well (102) is selected from the unpicked wells (104). The current well (106) may contain at least one key well log type for the portion current well (106) containing the estimated depth (312) at which the formation bounding surface (202) intersects the current well (106). In accordance with one or more embodiments, a key well log type may be a resistivity log, a gamma ray log, a density log, or a sonic slowness log.

In other embodiments, well log types measuring other physical quantities may be used as well as, or instead of, those listed above. However, it is desirable that the well log type shows a different response, such as a different value, range of values, or spatial variation, at depths above and below the formation bounding surface of interest.

Furthermore, a plurality of the training well (102) may be obtained. Each training well (102) must contain a picked depth (304) at least one of the key well log types contained by the current well (106) for the portion training well (102) containing the picked depth (312) in the current well (102). Each training well may be indexed with the subscript, i=1, 2, ..., N where N is the total number of training wells selected. Some training wells (102) may have more key well log types in common with the current well (106) than other training wells (102). For example, the current well (106) may have three key well logs, perhaps a resistivity log, a gamma ray log, and a density log. The training well (102) indexed by i=1 may have only a resistivity log and a gamma ray log, but the training well (102) indexed by i=2 may contain all three of key well log type contained in the current well (106). The number of key well log types that the i-th training well (102) has in common with the current well (106) may be denoted $M_i$.

In accordance with one or more embodiments, a Pearson correlation coefficient, $\rho_{v,i}$, may be calculated between the current well (106) and the i-th training well (102) for the v-th key well log type. The Pearson correlation coefficient may be given by:

$$\rho_{v,i}(\varsigma) = \frac{\sum_{k=1}^{D}(v_0(z-\varsigma)-\bar{v}_0)(v_i(z)-\bar{v}_i)}{\sqrt{\sum_{k=1}^{D}(v_0(z-\varsigma)-\bar{v}_0)^2}\sqrt{\sum_{k=1}^{D}(v_i(z)-\bar{v}_i)^2}} \quad \text{Equation (4)}$$

where $v_0$ is the v-th key well log type, such as a resistivity well log, in the current well (106) and $v_i$ is the same v-th key well log type in the i-th training well (102). The accent $\bar{x}$ denotes the arithmetic average of the D log samples (depth points) in the cross-correlation window (316) indexed by the argument z. The depth shift, $\varsigma$, is a scalar value by all of the key well logs in the current well are shifted from the depths over which they are measured. The depth shift is constrained to lie within the maximum depth shift window (314).

In accordance with one or more embodiments, the Pearson correlation coefficient, $\rho_{v,i}(\varsigma)$, for the depth shift, $\varsigma$, may be summed over the key well log types to give a well correlation score, $WCS_i(\varsigma)$ for the pair of wells consisting current well (106) and the i-th training well (102):

$$WCS_i(\varsigma) = \frac{\sum_{k=1}^{M_i} \rho_{v,i}(\varsigma)}{M_i} \quad \text{Equation (5)}$$

where $M_i$ are the number of key well log types that the current well (106) and the i-th training well (102) have in common. The well correlation score, $WCS_i(\varsigma)$, measures the sum over all the key log type of the similarity as determined by the Pearson correlation score between the i-th training well (102) and the current well (106) for a depth shift, ($\varsigma$), of the current well (106) from the estimated depth (312).

The well correlation score may now be summed over all the training wells (102), in accordance with one or more embodiments, to give a top correlation score, TCS. The top correlation score is also a function of the depth shift ($\varsigma$):

$$TCS(\varsigma) = \frac{\sum_{i=1}^{N} WCS_i(\varsigma)}{N}. \qquad \text{Equation (6)}$$

where N is the number of training wells (102). The top correlation score is a measure of the similarity between the set of training wells (102) and the current well (106) averaged over all the key well log types available in the current well (106) and each of the training wells (102) for each depth shift, $\varsigma$. The value of $\varsigma$ that maximizes TCS($\varsigma$) may, in accordance with one or more embodiments, indicate the depth discrepancy between the estimated depth (312) and the true depth (306) at which the formation bounding surface (202) intersects the current well (196).

In accordance with one or more embodiment, the value of $\varsigma$ that maximizes TCS($\varsigma$) may be determined by calculating the value of TCS($\varsigma$) for all values of $\varsigma$ within the maximum depth shift window (314) and selecting the maximum value of TCS($\varsigma$). This approach requires TCS($\varsigma$) to be calculated for all possible values of $\varsigma$ within the maximum depth shift window (314) first before the maximum TCS($\varsigma$) is calculated. This may be computationally expensive when a large number of training wells and a large maximum depth shift window are used. However, this approach does guarantee that the solution found is a true "global" maximum.

Figure 4A:
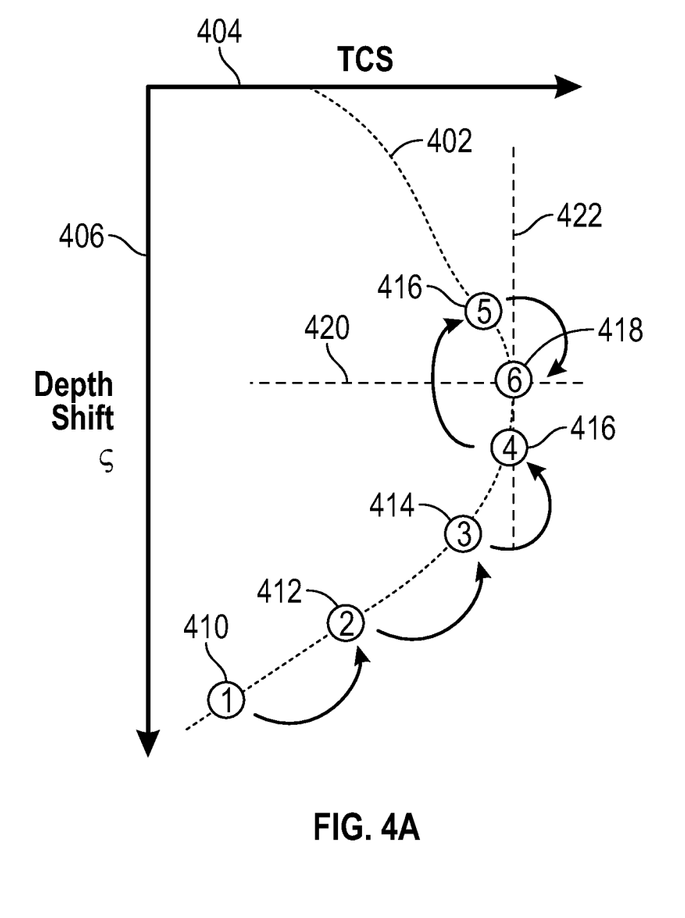
FIGS. 4A and 4B depicts values of a top correlation score for various depth shifts in accordance with one or more embodiments.
Figure 4B:
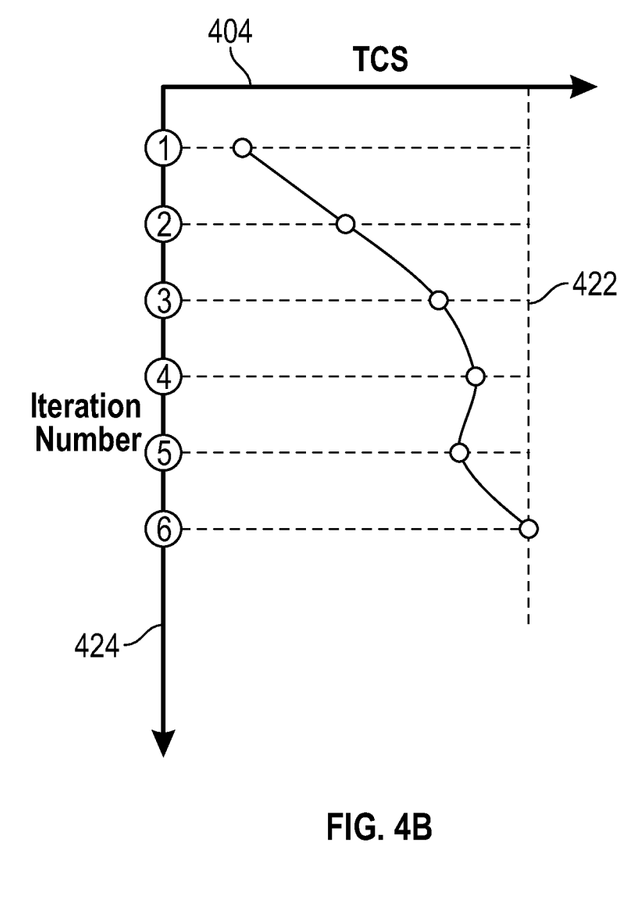

FIGS. 4A and 4B depict an alternative method of finding the value of $\varsigma$ that maximizes TCS($\varsigma$) using an iterative search numerical optimization method, in accordance with other embodiments. FIG. 4A shows the TCS($\varsigma$) curve (402), indicated on the horizontal axis (404), for a range of depth shifts $\varsigma$, indicated on the vertical axis (406). Rather than densely sampling the TCS($\varsigma$) curve (402) for every value of $\varsigma$, iterative search numerical optimization methods commence by choosing a small number, typically two, sample points (410, 412) and using the value of TCS at these points determine a new value of $\varsigma$ at which to evaluate TCS (414). The method then uses the new value of TCS (414) to select a new value of $\varsigma$ at which to evaluate TCS (416). If a new point new value of $\varsigma$ selected in the iteration causes TCS to cease to increase, such as the point labelled (418), then the iterative search algorithm may reverse its direction of search, causing a decreasing value of $\varsigma$ to be selected if $\varsigma$ had at preceding iterations been increasing, or causing an increasing value of $\varsigma$ to be selected if $\varsigma$ had at preceding iterations been decreasing. In accordance with one or more embodiments, the iterative search numerical optimization may terminate when a value of $\varsigma$ is reached (420) such that TCS decreases both large and smaller values of $\varsigma$ (422). Alternatively, the iterative search numerical optimization may terminate when a predetermined maximum number of iterations is reached. Alternatively, the iterative search numerical optimization may terminate when the value of $\varsigma$ reaches the limit of the maximum depth shift window (314). FIG. 4B shows the same iterative steps illustrated in FIG. 4A but with the vertical axis (424) indicating iteration number. The next iterative step, whether a greater or lesser value of $\varsigma$ is selected, would result in a value of TCS that is smaller than the value (422) at the $6^{th}$ iterative step and hence the method terminates.

The preceding paragraphs are predicated on the assumption that a maximum value of TCS is being sought. However, the problem of finding a maximum value of TCS may easily be transformed into a problem of finding a minimum value of a related quantity. For example, the problem of finding a maximum of TCS may easily be transformed into the problem of finding the minimum of $\overline{TCS}=K-TCS$, where K is a large number, greater than all values of TCS. Transforming the process of finding a maximum of TCS into a process of finding a minimum of a related quantity should be regarded as within the scope of the invention described herein.

Many iterative search numerical optimization methods are available to one of ordinary skill in the art for an optimization problem requiring finding either a maximum or a minimum value of TCS. They include, without limitation, the steepest decent method, the stochastic gradient descent method, the nonlinear conjugate gradient method, the Broyden-Fletcher-Goldfarb-Shannon (BFGS) method, the limited-memory BFGS method, and the simulated annealing.

Figure 5A:
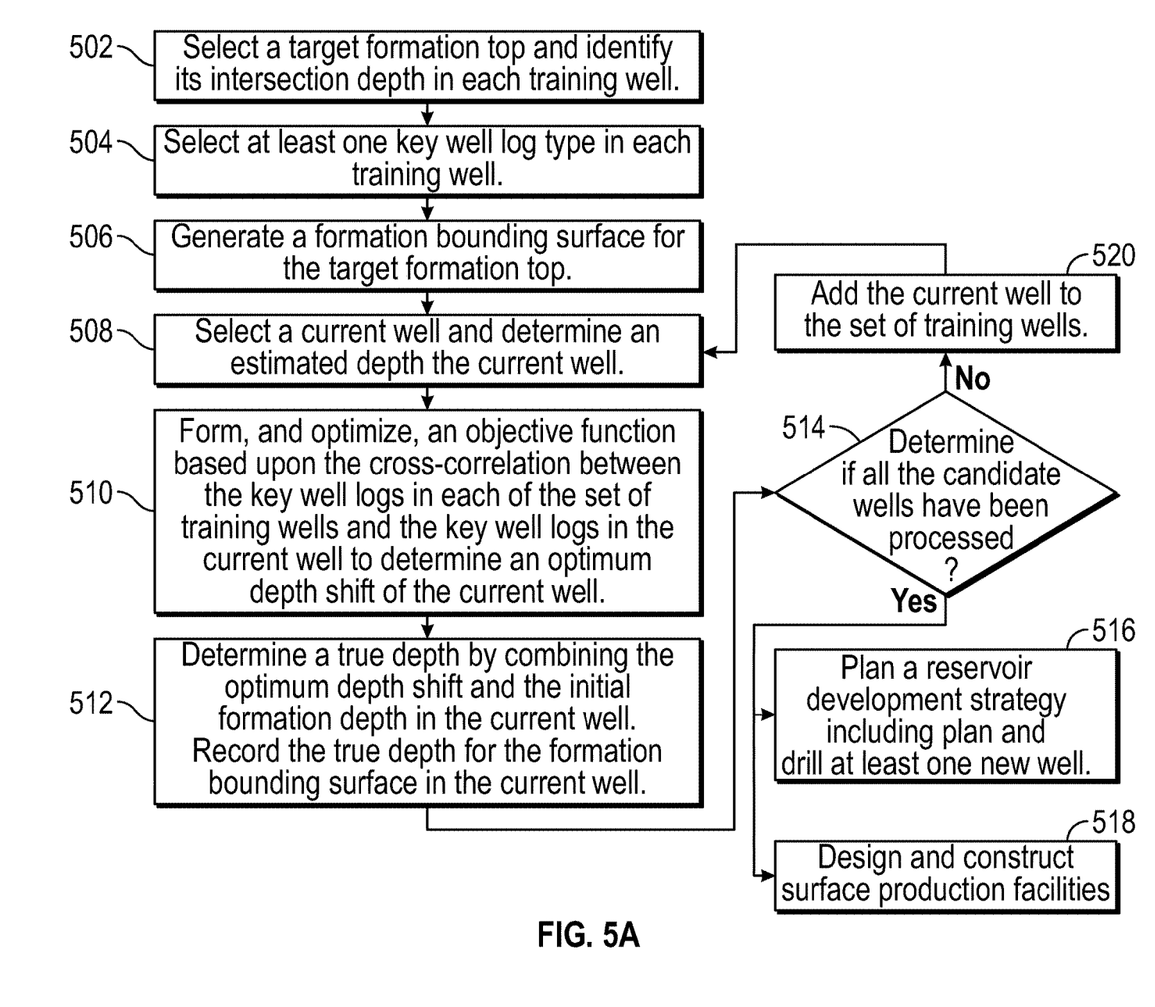
FIGS. 5A and 5B show flowcharts in accordance with one or more embodiments.

FIG. 5A shows a flowchart in accordance with one or more embodiments. In Step 502 a target formation bounding surface (202) is selected and the picked depth (304) at which the target formation bounding surface (202) intersects each training well (102) is obtained. The formation bounding surface (202) may be the top of a formation, or the bottom of a formation, or a particular feature within a formation, such as an interface between oil and water in the pores of the formation.

In Step 504, in accordance with one or more embodiments, at least one key well log type, for example a resistivity log, a density log, or a gamma ray log is selected. The key well log types may be selected so that the formation bounding surface (202) is clearly visible on the well log to one of ordinary skill in the art. According to one or more embodiments, training wells (102) may be selected based, at least in part, on their having a plurality of key well log types available for each training well (102). In accordance with one or more embodiments, every training well (102) must have the same plurality of key well log types. For example, training wells (102) may be chosen only if they each have a resistivity log, a density log, and a gamma ray log at the depth at which the formation bounding surface (202) intersects the training well (102). In accordance with other embodiments, each training well (102) may only be required to have a subset, but not all, of the key well log types.

In accordance with one or more embodiments, in Step 506, an estimated surface (310) may be determined using interpolation and/or extrapolation from the picked depths (304) in the training wells (102). The estimated surface (310) gives and estimate of the depth of the formation bounding surface (202) at a plurality of points between the training wells (102), including at the location of unpicked wells (104). In accordance with one or more embodiment, the interpolation and/or extrapolation may be performed using kriging, but other interpolation and/or extrapolation algorithms may be selected by one of ordinary skill in the art without departing from the scope of the invention.

In Step 508, a current well (106) is selected from the set of unpicked wells (104). According to one or more embodiments, the current well (106) may be selected at random from the set of unpicked wells (104). In accordance with other embodiments, the current well (106) may be selected using systematic criteria. For example, the current well (106) selected may be the closest unpicked well (104) to a training well (102) or the unpicked well (104) with the shortest mean spatial separation from all the training wells (102). In still other embodiments, the current well (102) may be selected, e.g., as the unpicked well (104) with the most easterly position. Many other systematic criteria may be used for selecting which unpicked well (104) becomes the current well (106) without departing form the scope of the invention.

Further, in Step 508, the estimated depth (312) at which the formation bounding surface (202) intersects the current well (106) may be determined, in accordance with one or more embodiments. The estimated depth (312) may be the depth at which the estimated surface (310) intersects the current well (106).

In Step 510, according to one or more embodiments, an objective function based upon the cross-correlation between the key well log types in each of the set of training wells and the key well log types in the current well to determine an optimum depth sift of the current well may be formed. The cross-correlation of each of the key well logs may be performed using a portion of each key well log type within a cross-correlation window (316). In accordance with one or more embodiments, the cross-correlation window in the current well (106) may be disposed symmetrically about the estimated depth (312) and disposed symmetrically about the picked depth (304) in each of the training wells (102).

Furthermore, in Step 510 the objective function may be optimized by varying a depth shift between the key well logs in the current well (106) and the key well logs in the training wells (102). The objective function may be the top correlation score, TCS. Optimizing the objective may involve finding an extremum as the depth shift varies. The extremum may be a maximum, or the extremum may be a minimum of the objective function. The magnitude of the depth shift may be constrained by the maximum depth shift window (314). Optimizing the objective function, in accordance with one or more embodiments, may determine an optimum depth shift.

In Step 512, the optimum depth shift, that may be positive or negative in value, may be added to the estimated depth (312) to give the true depth (306) at which the estimated surface (310) intersects the current well (106), in accordance with one or more embodiments. Further, the true depth (306) may be recorded in the database of a computer system, or in a non-transitory computer memory, or manually. The current well (106) is then removed from the set of unpicked wells (104).

In accordance with one or more embodiments, in Step 514, it is determined if there are any remaining unpicked wells (104) that have not already been selected as a current well. If one or more unpicked wells (104) remain the current well (106) is added to the set of picked wells in Step 520, the flowchart returns to Step 508, and a new current well (106) is selected. This loop, comprising selecting a new unpicked well (104) as a current well (106), identifying the true depth (306) at which the formation bounding surface (202) intersects the current well (106), and removing the current well (106) from the set of unpicked wells (104) and adding it to the set of picked wells, may be repeated until no unpicked wells (104) remain.

When no unpicked wells (104) remain the true depth (306) at which the formation bounding surface (202) intersect all the picked wells may be used to determine a more accurate and certain description of the shape of a formation including its lateral extent and the topography of the bounding surfaces above and below the reservoir. In Step 516, this description of the shape of a formation may be used for planning a development strategy for the hydrocarbon reservoir. For example, the more accurate and certain description of the shape of the formation may reveal previously unknown geological faults which may hydraulically isolate segments of the reservoir. Production of hydrocarbons from such hydraulically isolated portions of the reservoir may require the drilling of additional wells or the modification of the trajectory of wells already planned. In other embodiments, the more accurate and certain description of the shape of the formation may reveal new structural traps in which hydrocarbons may be accumulated.

The discovery of new hydraulically isolated portions of the reservoir, the determination of a more accurate and certain description of the shape of a formation, and the identification of new structural traps may all change the estimate of the volume of producible hydrocarbon present in the reservoir. In addition to the change in economic value caused by this new estimate of the volume of producible hydrocarbon it may require the design and modification of new surface production facilities. In Step 518, in accordance with one or more embodiments, new surface production facilities may be designed and constructed, or existing surface production facility designs may be modified base, at least in part, on the more accurate and certain estimate of the volume of producible hydrocarbon present in the reservoir. Surface production facilities may include, without limitation, storage tanks, pipelines, crude oil and gas treatment facilities such as gas oil separation plants, and refineries.

Figure 5B:
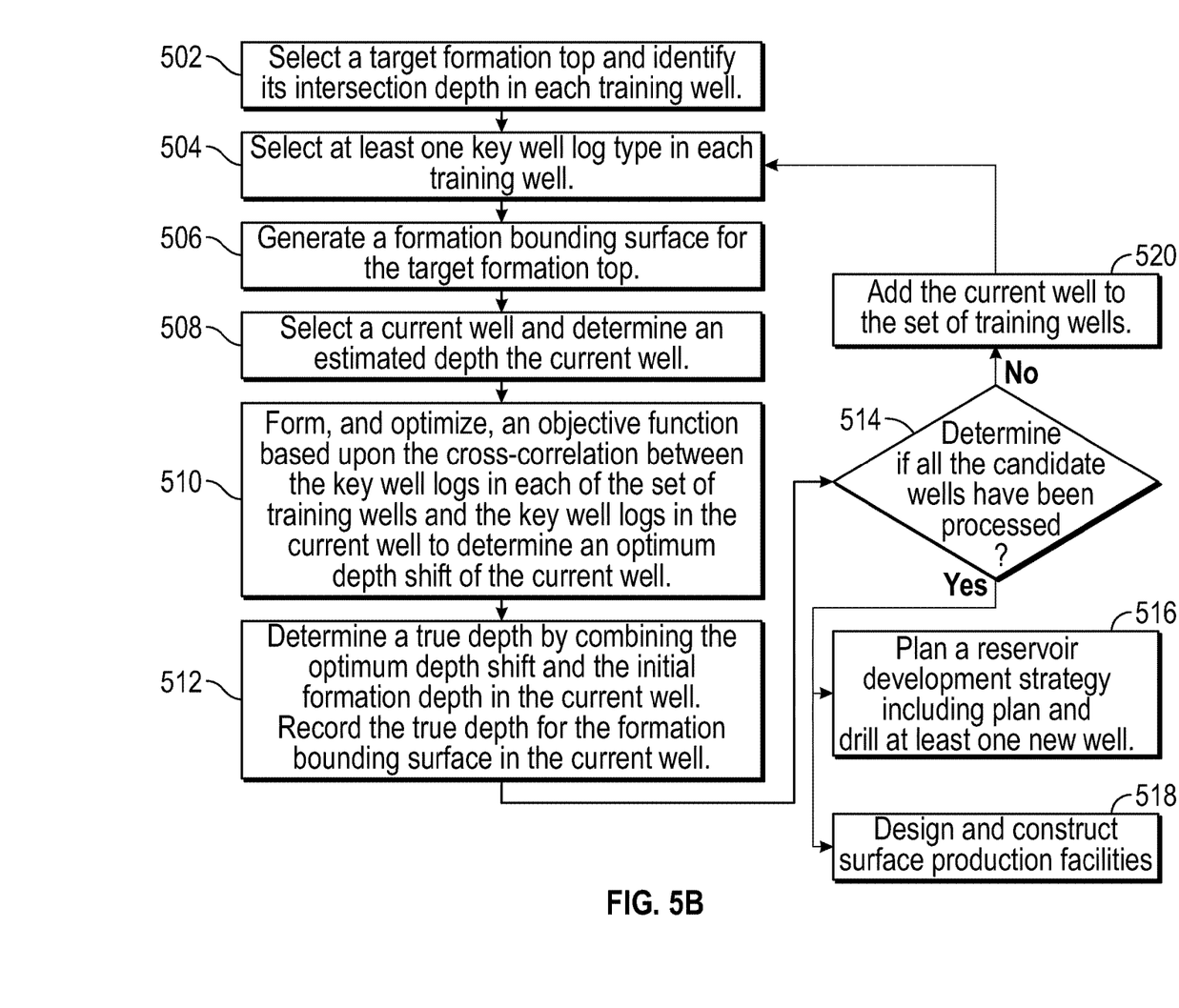

FIG. 5B shows a modification of the flowchart shown in FIG. 5A, in accordance with one or more embodiments. In Step 520 of FIG. 5A, the current well (106) is removed from the set of unpicked wells (104) and added to the set of picked wells and plays no further part in the determining the true depth (306) at which the formation surface (202) intersects with the remaining members of the set of unpicked wells (104). However, in FIG. 5B, in accordance with one or more embodiments, Step 522 replaces Step 520 of FIG. 5A. In Step 522, the current well (106) is added to the set of training wells (102) and the flowchart returns to Step 504 and the iterative loop is repeated with the new, expanded set of training wells (104). In this embodiment the number of training wells (104) increments by one each time the iterative loop is executed.

Figure 6:
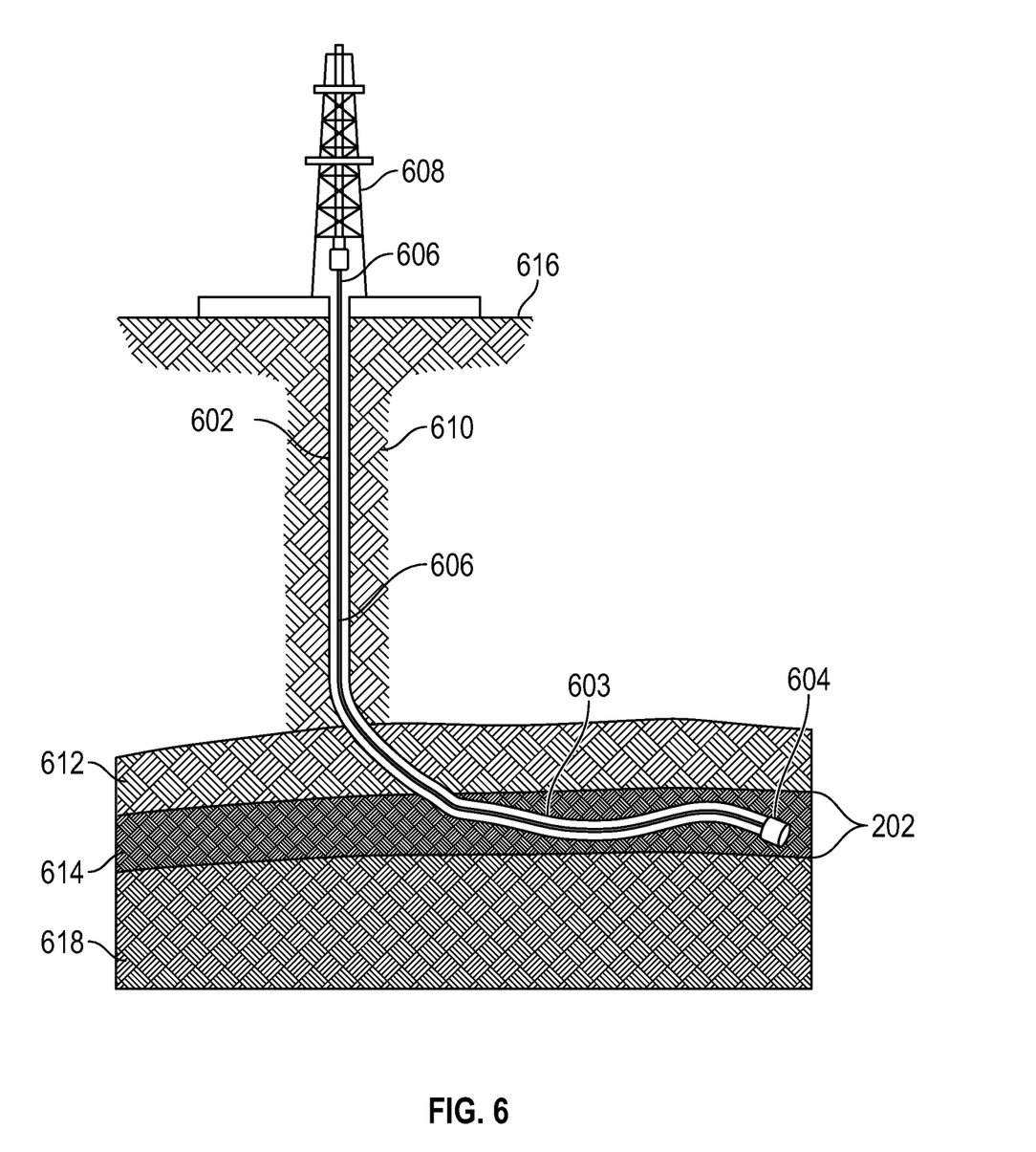
FIG. 6 shows a system in accordance with one or more embodiments.

FIG. 6 illustrates systems in accordance with one or more embodiments. As shown in FIG. 6, a borehole (602) may be drilled by a drill bit (604) attached by a drillstring (606) to a drill rig (608) located on the Earth's surface (616). The borehole may traverse a plurality of overburden layers (610) and one or more cap-rock layers (612) to a hydrocarbon reservoir (614). One or more formation bounding surfaces (202) may be used to plan and perform the location of the borehole (602) on the Earth's surface (616) and the curved borehole path (603). In accordance with one or more embodiments, the formation bounding surface (202) may the interface between the top of the reservoir (614) and the cap rock (612). In accordance with other embodiments, the formation bounding surface (202) may the interface between the bottom of the reservoir (614) and the top of the formation lying immediately below the reservoir (618).

Figure 7:
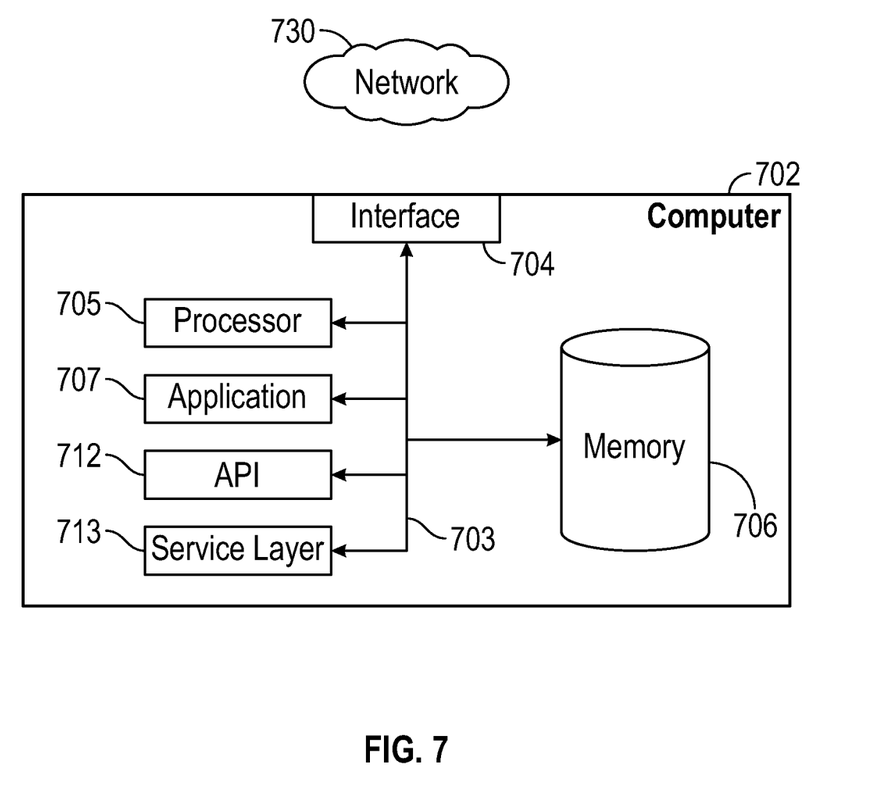
FIG. 7 shows a computer system, in accordance with one or more embodiments.

Embodiments may be implemented on a computer system. FIG. 7 is a block diagram of a computer system (702) used to provide computational functionalities associated with described algorithms, methods, functions, processes, flows, and procedures as described in the instant disclosure, according to an implementation. The illustrated computer (702) is intended to encompass any computing device such as a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (702) may include a computer that includes an input device, such as a keypad, keyboard, touch screen, or other device that can accept user information, and an output device that conveys information associated with the operation of the computer (702), including digital data, visual, or audio information (or a combination of information), or a GUI.

The computer (702) can serve in a role as a client, network component, a server, a database or other persistency, or any other component (or a combination of roles) of a computer system for performing the subject matter described in the instant disclosure. The illustrated computer (702) is communicably coupled with a network (730). In some implementations, one or more components of the computer (702) may be configured to operate within environments, including cloud-computing-based, local, global, or other environment (or a combination of environments).

At a high level, the computer (702) is an electronic computing device operable to receive, transmit, process, store, or manage data and information associated with the described subject matter. According to some implementations, the computer (702) may also include or be communicably coupled with an application server, e-mail server, web server, caching server, streaming data server, business intelligence (BI) server, or other server (or a combination of servers).

The computer (702) can receive requests over network (730) from a client application (for example, executing on another computer (702)) and responding to the received requests by processing the said requests in an appropriate software application. In addition, requests may also be sent to the computer (702) from internal users (for example, from a command console or by other appropriate access method), external or third-parties, other automated applications, as well as any other appropriate entities, individuals, systems, or computers.

Each of the components of the computer (702) can communicate using a system bus (703). In some implementations, any or all of the components of the computer (702), both hardware or software (or a combination of hardware and software), may interface with each other or the interface (704) (or a combination of both) over the system bus (703) using an application programming interface (API) (712) or a service layer (713) (or a combination of the API (712) and service layer (713). The API (712) may include specifications for routines, data structures, and object classes. The API (712) may be either computer-language independent or dependent and refer to a complete interface, a single function, or even a set of APIs. The service layer (713) provides software services to the computer (702) or other components (whether illustrated, or) that are communicably coupled to the computer (702). The functionality of the computer (702) may be accessible for all service consumers using this service layer. Software services, such as those provided by the service layer (713), provide reusable, defined business functionalities through a defined interface. For example, the interface may be software written in JAVA, C++, or other suitable language providing data in extensible markup language (XML) format or another suitable format. While illustrated as an integrated component of the computer (702), alternative implementations may illustrate the API (712) or the service layer (713) as stand-alone components in relation to other components of the computer (702) or other components (whether or not illustrated) that are communicably coupled to the computer (702). Moreover, any or all parts of the API (712) or the service layer (713) may be implemented as child or sub-modules of another software module, enterprise application, or hardware module without departing from the scope of this disclosure.

The computer (702) includes an interface (704). Although illustrated as a single interface (704) in FIG. 7, two or more interfaces (704) may be used according to particular needs, desires, or particular implementations of the computer (702). The interface (704) is used by the computer (702) for communicating with other systems in a distributed environment that are connected to the network (730). Generally, the interface (704 includes logic encoded in software or hardware (or a combination of software and hardware) and operable to communicate with the network (730). More specifically, the interface (704) may include software supporting one or more communication protocols associated with communications such that the network (730) or interface's hardware is operable to communicate physical signals within and outside of the illustrated computer (702).

The computer (702) includes at least one computer processor (705). Although illustrated as a single computer processor (705) in FIG. 7, two or more processors may be used according to particular needs, desires, or particular implementations of the computer (702). Generally, the computer processor (705) executes instructions and manipulates data to perform the operations of the computer (702) and any algorithms, methods, functions, processes, flows, and procedures as described in the instant disclosure.

The computer (702) also includes a memory (706) that holds data for the computer (702) or other components (or a combination of both) that can be connected to the network (730). For example, memory (706) can be a database storing data consistent with this disclosure. Although illustrated as a single memory (706) in FIG. 7, two or more memories may be used according to particular needs, desires, or particular implementations of the computer (702) and the described functionality. While memory (706) is illustrated as an integral component of the computer (702), in alternative implementations, memory (706) can be external to the computer (702).

The application (707) is an algorithmic software engine providing functionality according to particular needs, desires, or particular implementations of the computer (702), particularly with respect to functionality described in this disclosure. For example, application (707) can serve as one or more components, modules, applications, etc. Further, although illustrated as a single application (707), the application (707) may be implemented as multiple applications (707) on the computer (702). In addition, although illustrated as integral to the computer (702), in alternative implementations, the application (707) can be external to the computer (702).

There may be any number of computers (702) associated with, or external to, a computer system containing computer (702), wherein each computer (702) communicates over network (730). Further, the term "client," "user," and other appropriate terminology may be used interchangeably as appropriate without departing from the scope of this disclosure. Moreover, this disclosure contemplates that many users may use one computer (702), or that one user may use multiple computers (702).

Although only a few example embodiments have been described in detail above, those skilled in the art will readily appreciate that many modifications are possible in the example embodiment without materially departing from this invention. Accordingly, all such modifications are intended to be included within the scope of this disclosure as defined in the following claims. In the claims, any means-plus-function clauses are intended to cover the structures described herein as performing the recited function(s) and equivalents of those structures. Similarly, any step-plus-function clauses in the claims are intended to cover the acts described here as performing the recited function(s) and equivalents of those acts. It is the express intention of the applicant not to invoke 35 U.S.C. § 112(f) for any limitations of any of the claims herein, except for those in which the claim expressly uses the words "means for" or "step for" together with an associated function.

What is claimed is:

1. A method comprising:
    obtaining, using a computer, at least one key log in each of a set of training wells located within a hydrocarbon reservoir;
    identifying a target formation bounding surface in each of the set of training wells;
    generating, by the computer, an initial depth surface for the target formation bounding surface from the target formation bounding surface in each of the set of training wells;
    determining, by the computer, from the initial depth surface for the target formation bounding surface an initial depth estimate of the target formation bounding surface at a location of a current well;
    forming, by the computer, an objective function based on a correlation between each key log in each of the set of training wells and each corresponding key log in the current well to determine an optimum depth shift of the current well;
    optimizing, by the computer, the objective function by varying a depth shift between each of the set of training wells and the current well, to determine an optimum depth shift that produces an extremum of the objective function;
    combining, by the computer, the initial depth estimate of the target formation bounding surface at the location of the current well with the optimum depth shift to produce a final depth estimate of the target formation bounding surface at the location of the current well;
    planning a new well trajectory within the hydrocarbon reservoir based on the final depth estimate, and
    drilling, using a drill rig, a new well within the hydrocarbon reservoir guided by the new well trajectory,
    wherein the objective function comprises a top correlation score that is a first summation of a plurality of well correlation scores determined for each training well;
    wherein each well correlation score of the plurality of well correlation scores is determined as a second summation of a plurality of Pearson correlation coefficients calculated between each of the set of training wells and the current well, and divided by the total number of key well log types that each of the set of training wells and the current well have in common;
    wherein the Pearson correlation coefficient is a function of depth shift, and
    wherein a key log comprises a resistivity log, a gamma ray log, a density log, or a sonic slowness log.

2. The method of claim 1, further comprising: designing and constructing surface production facilities to process hydrocarbons produced from the hydrocarbon reservoir.

3. The method of claim 1: wherein generating the initial depth surface for the target formation bounding surface, further comprises using an interpolation method selected from a group consisting of simple kriging, ordinary kriging, universal kriging, indicator kriging, probability kriging, disjunctive kriging, inverse distance weighted interpolation, natural neighbor inverse distance weighted interpolation, natural cubic spline interpolation, B-spline interpolation, and Hermite spline interpolation.

4. The method of claim 1: wherein determining from the initial depth surface for the target formation bounding surface the initial depth estimate of the target formation bounding surface at the location of the current well, further comprises determining a depth of the initial depth surface at the location of the current well.

5. The method of claim 1:
    wherein forming the objective function based on the correlation between each key log in each of the set of training wells, and each corresponding key log in the current well, further comprises:
        selecting, for each key log in each of the set of training wells, a portion of the key log defined by a cross-correlation window;
        depth-shifting the portion of each key log by a difference between a value of the initial depth surface at a location of each of the training well and the current well;
        selecting, for the current well, the portion of the key log defined by the cross-correlation window;
        calculating the cross-correlation value between the key log in the training well and the key log in the current well for the depth shift, wherein the depth shift lies within a maximum depth shift window; and
        summing the cross-correlation value for each key log in each of the set of training wells to determine a formation bounding surface correlation value.

6. The method of claim 5:
    wherein optimizing the objective function, further comprises:
        selecting a new depth shift within the maximum depth shift window based on a previous determination of the formation bounding surface correlation value;
        evaluating the objective function based on the new depth shift;
        determining whether a stopping criterium has been met; and
        executing an action selected from a group consisting of updating the new depth shift and terminating the optimization, based on the determination of whether the stopping criterium has been met.

7. The method of claim 6: wherein the stopping criterium of the optimization is selected from a group consisting of: determining a local extremum of the objective function, determining an asymptote of the objective function, and evaluating the objective function a predetermined number of times.

8. The method of claim 1: wherein the extremum of the objective function is selected from a group consisting of a maximum and a minimum.

9. The method of claim 1: wherein combining, by the computer, the initial depth estimate of the target formation bounding surface at the location of the current well with the optimum depth shift to produce the final depth estimate of the target formation bounding surface at the location of the current well, further comprises adding the optimum depth shift to the initial depth estimate of the target formation bounding surface to obtain the final depth estimate of the target formation bounding surface at the location of the current well.

10. A system comprising:
a computer configured to:
obtain at least one key log in each of a set of training wells located within a hydrocarbon reservoir;
identify a target formation bounding surface in each of the set of training wells;
generate an initial depth surface for the target formation bounding surface from the target formation bounding surface in each of the set of training wells;
determine from the initial depth surface for the target formation bounding surface an initial depth estimate of the target formation bounding surface at a location of a current well;
form an objective function based on a correlation between each key log in each of the set of training wells and each corresponding key log in the current well to determine an optimum depth shift of the current well;
optimize the objective function by varying a depth shift between each of the set of training wells and the current well to determine an optimum depth shift that produces an extremum of the objective function;
combine the initial depth estimate of the target formation bounding surface at the location of the current well with the optimum depth shift to produce a final depth estimate of the target formation bounding surface at the location of the current well, and
plan a new well trajectory within the hydrocarbon reservoir based on the final depth estimate,
wherein the objective function comprises a top correlation score that is a first summation of a plurality of well correlation scores determined for each training well;
wherein each well correlation score of the plurality of well correlation scores is determined as a second summation of a plurality of Pearson correlation coefficients calculated between each of the set of training wells and the current well, and divided by the total number of key well log types that each of the set of training wells and the current well have in common;
wherein the Pearson correlation coefficient is a function of depth shift, and
wherein a key log comprises a resistivity log, a gamma ray log, a density log, or a sonic slowness log, and
a drilling system, configured to drill a new well within the hydrocarbon reservoir guided by the new well trajectory.

11. The system of claim 10 further comprising functionality for: designing a surface production facility to process hydrocarbons produced from the hydrocarbon reservoir.

12. The system of claim 10: wherein generating the initial depth surface for the target formation bounding surface further comprises using an interpolation method selected from a group consisting of simple kriging, ordinary kriging, universal kriging, indicator kriging, probability kriging, disjunctive kriging, inverse distance weighted interpolation, natural neighbor inverse distance weighted interpolation, natural cubic spline interpolation, B-spline interpolation, and Hermite spline interpolation.

13. The system of claim 10: wherein determining from the initial depth surface for the target formation bounding surface the initial depth estimate of the target formation bounding surface at the location of the current well further comprises determining a depth of the initial depth surface at the location of the current well.

14. The system of claim 10: wherein forming the objective function based on the correlation between each key log in each of the set of training wells and each corresponding key log in the current well, further comprising:
selecting, for each key log in each of the set of training wells, a portion of the key log defined by a cross-correlation window;
depth-shifting the portion of each key log by a difference between a value of the initial depth surface at a location of each of the training well and the current well;
selecting, for the current well, the portion of the key log defined by the cross-correlation window;
calculating the cross-correlation value between the key log in the training well and the key log in the current well for the depth shift, wherein the depth shift lies within a maximum depth shift window; and
summing the cross-correlation value for each key log in each of the set of training wells to determine a formation bounding surface correlation value.

15. The system of claim 14: wherein optimizing the objective function further comprises:
selecting a new depth shift within the maximum depth shift window based on a previous determination of the formation bounding surface correlation value;
evaluating the objective function based on the new depth shift;
determining whether a stopping criterium has been met; and
executing an action selected from a group consisting of updating the new depth shift and terminating the optimization based on the determination of whether the stopping criterium has been met.

16. The system of claim 15: wherein the stopping criterium of the optimization is selected from the group consisting of determining a local extremum of the objective function, determining an asymptote of the objective function, and evaluating the objective function a predetermined number of times.

17. The system of claim 10: wherein the extremum of the objective function is selected from a group consisting of a maximum and a minimum.

18. The system of claim 10: wherein combining the initial depth estimate of the target formation bounding surface at the location of the current well with the optimum depth shift to produce the final depth estimate of the target formation bounding surface at the location of the current well further comprises adding the optimum depth shift to the initial depth estimate of the target formation bounding surface to obtain the final depth estimate of the target formation bounding surface at the location of the current well.

* * * * *